(12) United States Patent
Okuno

(10) Patent No.: US 11,145,350 B2
(45) Date of Patent: Oct. 12, 2021

(54) MEMORY DEVICE FOR REFRESHING REDUNDANCY AREA WORD LINES, AND REFRESH METHOD THEREOF

(71) Applicant: Winbond Electronics Corp., Taichung (TW)

(72) Inventor: Shinya Okuno, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/942,793

(22) Filed: Jul. 30, 2020

(65) Prior Publication Data
US 2021/0035625 A1   Feb. 4, 2021

(30) Foreign Application Priority Data
Aug. 1, 2019  (JP) .............................. JP2019-141855

(51) Int. Cl.
*G11C 11/406* (2006.01)
*G11C 11/408* (2006.01)

(52) U.S. Cl.
CPC ..... *G11C 11/40611* (2013.01); *G11C 11/4085* (2013.01); *G11C 11/4087* (2013.01); *G11C 11/40622* (2013.01)

(58) Field of Classification Search
CPC .......... G11C 11/40611; G11C 11/4087; G11C 11/4085; G11C 11/40622; G11C 29/783; G11C 11/406
See application file for complete search history.

(56) References Cited

U.S. PATENT DOCUMENTS

| 7,719,906 | B2 | 5/2010 | Tanimura et al. | |
|---|---|---|---|---|
| 9,805,782 | B1* | 10/2017 | Liou | ...... G11C 11/403 |
| 2009/0161457 | A1 | 6/2009 | Wakimoto | |
| 2010/0246299 | A1 | 9/2010 | Wai et al. | |
| 2011/0149665 | A1* | 6/2011 | Koo | ...... G11C 17/16 365/200 |
| 2016/0005452 | A1* | 1/2016 | Bae | ...... G11C 29/74 714/764 |

(Continued)

FOREIGN PATENT DOCUMENTS

| CN | 105321550 | 2/2016 |
|---|---|---|
| KR | 20150132366 | 11/2015 |

(Continued)

OTHER PUBLICATIONS

"Office Action of Korea Counterpart Application" with English translation thereof, dated Jul. 27, 2020, p. 1-p. 7.

*Primary Examiner* — Mushfique Siddique
(74) *Attorney, Agent, or Firm* — JCIPRNET

(57) ABSTRACT

A memory device and a refresh method thereof are provided. The memory device includes a memory array and a controller. The memory array includes a plurality of normal areas and a redundancy area near the plurality of normal areas. The redundancy area includes a plurality of redundancy word lines. A plurality of boundary word lines are arranged near boundaries between the plurality of normal areas and the redundancy area. The controller refreshes the plurality of redundancy word lines in sequence, and refreshes the plurality of boundary word lines in sequence after refreshing the plurality of redundancy word lines in sequence.

13 Claims, 5 Drawing Sheets

(56) References Cited

U.S. PATENT DOCUMENTS

2016/0042782 A1* 2/2016 Narui .................... G11C 11/406
                                                                                       365/222
2018/0158507 A1    6/2018 Bang
2021/0035624 A1* 2/2021 Okuno .................. G11C 11/408

FOREIGN PATENT DOCUMENTS

| KR | 20160004098 | 1/2016 |
|---|---|---|
| TW | 201823968 | 7/2018 |

\* cited by examiner

MEMORY DEVICE FOR REFRESHING REDUNDANCY AREA WORD LINES, AND REFRESH METHOD THEREOF

CROSS-REFERENCE TO RELATED APPLICATION

This application claims the priority benefit of Japan application serial no. 2019-141855, filed on Aug. 1, 2019. The entirety of the above-mentioned patent application is hereby incorporated by reference herein and made a part of this specification.

BACKGROUND OF THE INVENTION

1. Field of the Invention

The present invention relates to a memory device and a refresh method thereof, and in particular, to a memory device for refreshing a redundancy area word line, and a refresh method thereof.

2. Description of Related Art

When there is a specific word line (also called an aggressor word line) that is accessed for multiple times in a dynamic random access memory (DRAM), memory cells on a word line (also called a victim word line) adjacent to the aggressor word line will lose stored data due to cross talk or coupling effects. This type of interference is called a row hammer phenomenon.

The existing technology avoids the row hammer phenomenon by additionally refreshing the victim word line. That is, the victim word line has a higher refresh frequency. However, in some DRAM structures with high memory cell density, the address calculation of the victim word line is more complicated. Therefore, a larger-area refresh address calculator (also called a row hammer address calculator) is needed to calculate an address of the victim word line.

SUMMARY OF THE INVENTION

The present invention provides a memory device and a refresh method thereof, which do not calculate a word line address that needs to be refreshed due to a row hammer in a redundancy area so as to reduce the area of a refresh address calculator thereof.

An embodiment of the present invention provides a memory device. The memory device includes a memory array and a controller. The memory array includes a plurality of normal areas and a redundancy area near the plurality of normal areas. The redundancy area includes a plurality of redundancy word lines. A plurality of boundary word lines is arranged near boundaries between the plurality of normal areas and the redundancy area. The controller refreshes the plurality of redundancy word lines in sequence, and refreshes the plurality of boundary word lines in sequence after refreshing the plurality of redundancy word lines in sequence.

An embodiment of the present invention provides a refresh method of a memory device. The memory device includes a memory array and a controller. The memory array includes a plurality of normal areas and a redundancy area near the plurality of normal areas. Each of the normal areas comprising a plurality of normal word lines. The redundancy area includes a plurality of redundancy word lines. The refresh method includes, but is not limited to, the following steps: defining part of normal word lines and part of redundancy word lines near boundaries between the normal areas and the redundancy area as a plurality of boundary word lines; refreshing the plurality of redundancy word lines in sequence, and refreshing the plurality of boundary word lines in sequence after refreshing the plurality of redundancy word lines in sequence.

Based on the above, in some embodiments of the present invention, the memory device and the refresh method thereof can reduce the area of a refresh address calculator. A controller refreshes redundancy word lines and boundary word lines in a memory array in sequence. Since it is unnecessary to calculate a word line address that needs to be refreshed due to a row hammer in a redundancy area, the area of a refresh address calculator can be reduced.

In order to make the aforementioned and other objectives and advantages of the present invention comprehensible, embodiments accompanied with figures are described in detail below.

DESCRIPTION OF THE EMBODIMENTS

Figure 1:
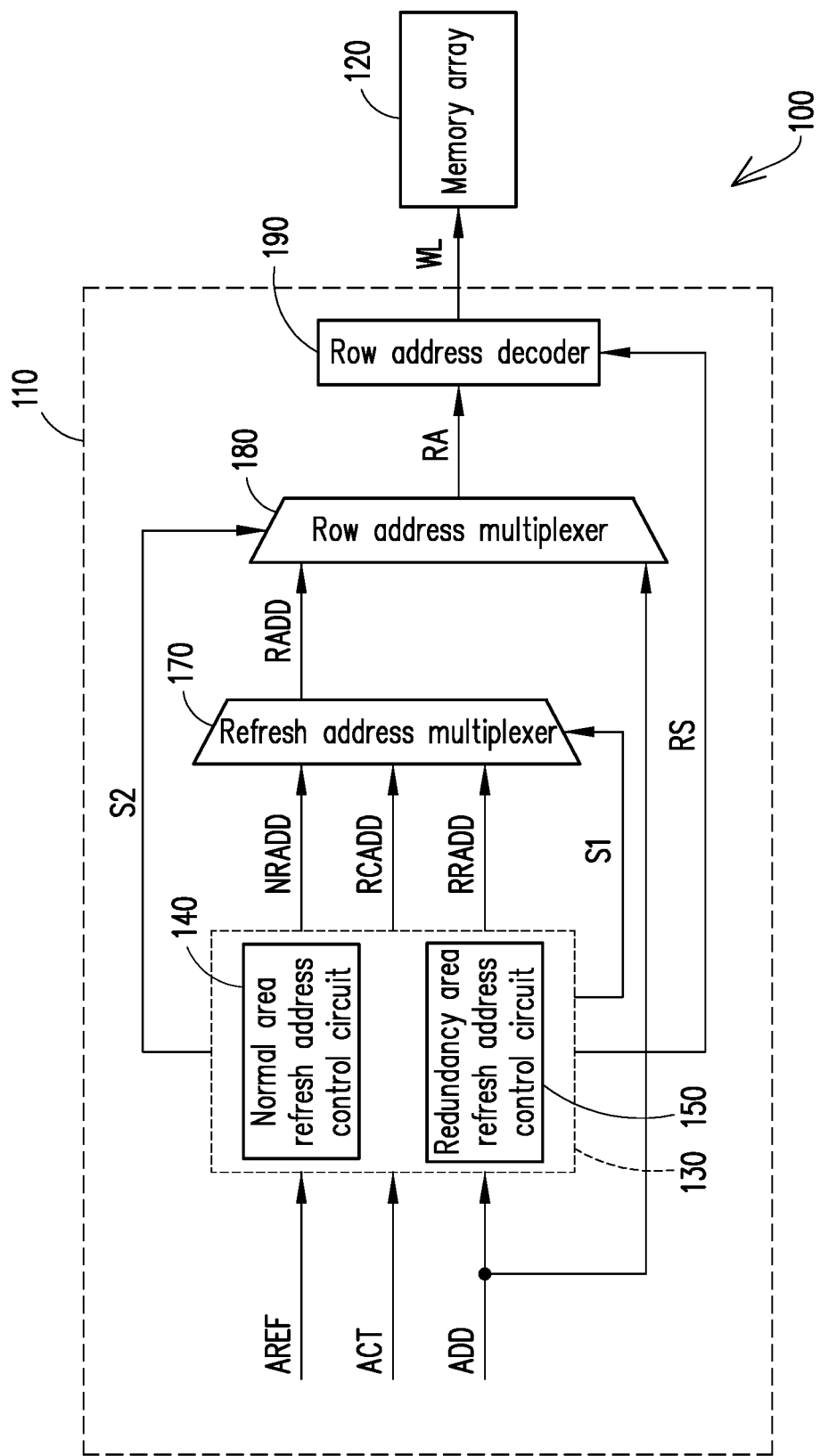
FIG. 1 is a schematic diagram of a memory device according to an embodiment of the present invention.

Referring to FIG. 1, in an embodiment, a memory device 100 includes a controller 110 and a memory array 120. The controller 110 is coupled to the memory array 120. The controller 110 includes a refresh address calculator 130, a refresh address multiplexer 170, a row address multiplexer 180, and a row address decoder 190. The controller 110 is configured to provide a word line address WL to the memory array 120 according to an active command signal ACT, an auto-refresh command signal AREF, and an address ADD.

Figure 2:
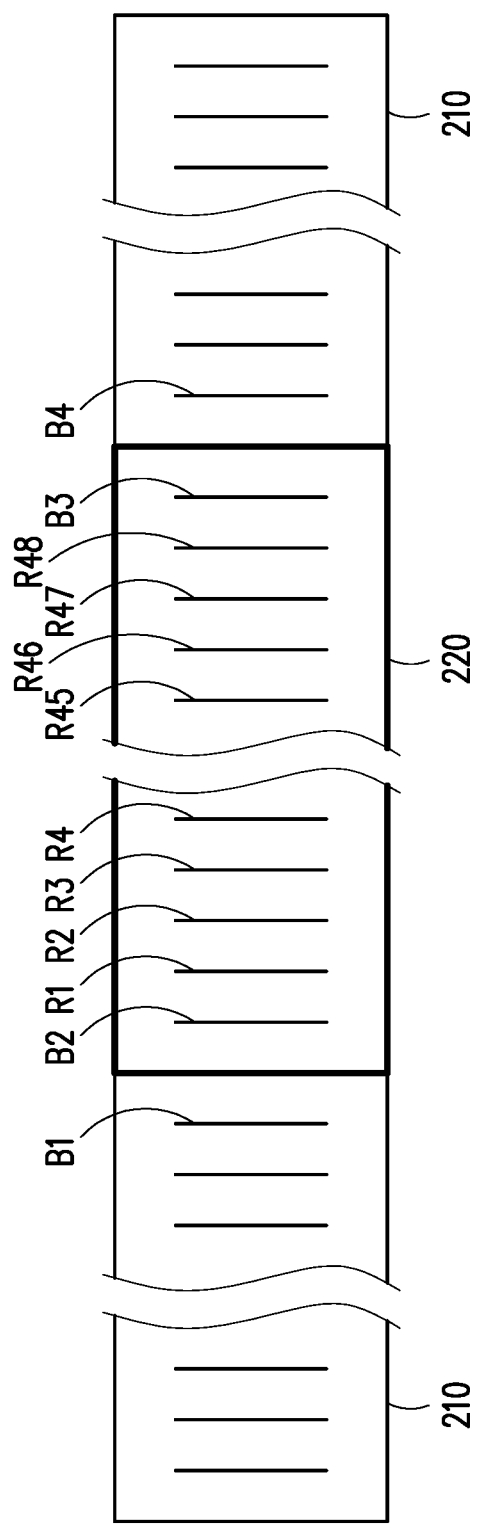
FIG. 2 is a schematic layout diagram of word lines in a memory array according to an embodiment of the present invention.

The memory array 120 includes, for example, a plurality of dynamic random access memory cells. The present invention does not limit the type and structure of the memory array 120. Referring to FIG. 2, in an embodiment, the memory array 120 includes normal areas 210 and a redundancy area 220 adjacent to the normal areas 210. The number of the normal areas 210 and an adjacency relationship between the normal areas 210 and the redundancy area 220 are only an example and are not limited thereto. The redundancy area 220 has redundancy memory cells arranged in row direction and column direction for replacing bad or damaged memory cells in the normal areas 210 to maintain normal functions of the memory device 100. The memory array 120 receives the word line address WL to refresh the memory cells in the memory array 120, thereby avoiding loss of stored data caused by a row hammer phenomenon. In an embodiment, the redundancy area 220 includes a plurality of redundancy word lines R1-R48. A plurality of boundary word lines B1-B4 are arranged near boundaries between the plurality of normal areas 210 and the redundancy area

220. In the present embodiment, a boundary word line B1 and a boundary word line B4 are arranged in the normal areas 210. Namely, the boundary word line B1 and the boundary word line B4 may be used as normal word lines. A boundary word line B2 and a boundary word line B3 are arranged in the redundancy area 220. Namely, the boundary word line B2 and the boundary word line B3 may be used as redundancy word lines. The number of the redundancy word lines R1-R48 and the number of the boundary word lines B1-B4 depend on the architecture of the plurality of normal areas 210 and the redundancy area 220. The present invention is not limited thereto.

The refresh address calculator 130 is configured to provide a normal area refresh address NRADD and a redundancy area refresh address RRADD to the refresh address multiplexer 170 according to the active command signal ACT, the auto-refresh command signal AREF, and the address ADD. The refresh address calculator 130 is further configured to calculate the pulse ordinal number of the auto-refresh command signal AREF to provide a refresh counting address RCADD to the refresh address multiplexer 170, and respectively provide a selection signal S1, a selection signal S2, and a refresh status signal RS to the refresh address multiplexer 170, the row address multiplexer 180, and the row address decoder 190. In detail, the refresh address calculator 130 includes a normal area refresh address control circuit 140 and a redundancy area refresh address control circuit 150. The normal area refresh address control circuit 140 is configured to provide the normal area refresh address NRADD to the refresh address multiplexer 170 according to the active command signal ACT and the address ADD so as to provide an address that needs to be refreshed in the normal area 210 to the refresh address multiplexer 170. The redundancy area refresh address control circuit 150 is configured to receive the auto-refresh command signal AREF, and generate a plurality of redundancy area refresh addresses RRADD in sequence to the refresh address multiplexer 170 according to the auto-refresh command signal AREF, a plurality of redundancy word line addresses RA1-RA48, and a plurality of boundary word line addresses BA1-BA4, so as to provide an address that needs to be refreshed in the redundancy area 220. The plurality of redundancy word line addresses RA1-RA48 and the plurality of boundary word line addresses BA1-BA4 are addresses corresponding to the plurality of redundancy word lines R1-R48 and the plurality of boundary word lines B1-B4. In an embodiment, the controller 110 refreshes the redundancy word lines R1-R48 in sequence according to the plurality of redundancy area refresh addresses RRADD, and refreshes the boundary word lines B1-B4 in sequence after refreshing the redundancy word lines R1-R48 in sequence.

The refresh address multiplexer 170 is coupled to the refresh address calculator 130. The refresh address multiplexer 170 is configured to receive the normal area refresh address NRADD, the redundancy area refresh address RRADD, the refresh counting address RCADD, and the selection signal S1, and select an address according to the selection signal S1 to output a refresh address RADD to the row address multiplexer 180.

The row address multiplexer 180 is coupled to the refresh address multiplexer 170. The row address multiplexer 180 is configured to receive the refresh address RADD and a selection signal S2, and select an address according to the selection signal S2 to output a row address RA to the row address decoder 190.

The row address decoder 190 is coupled to the row address multiplexer 180. The row address decoder 190 is configured to receive the row address RA and the refresh status signal RS, and perform decoding according to the row address RA and the refresh status signal RS to provide the word line address WL to the memory array 120, so as to refresh the corresponding word line in the memory array 120. The refresh status signal RS is used for determining a refresh timing sequence of the redundancy word lines R1-R48 and the boundary word lines B1-B4.

In an embodiment, the refresh timing sequence of the controller 110 is to refresh the redundancy word lines R1-R48 in sequence and then refresh the boundary word lines B1-B4 in sequence. For example, the controller 110 first refreshes the redundancy word line R1, then refreshes the redundancy word line R2, and so on, and finally refreshes the redundancy word line R48. After the controller 110 refreshes the redundancy word lines R1-R48 in sequence, the controller 110 then refreshes the boundary word lines B1-B4 in sequence. For example, the controller first refreshes the boundary word line B1, then refreshes the boundary word line B2, and so on, and finally refreshes the boundary word line B4. It is to be noted that the sequence in which the controller 110 refreshes the redundancy word lines R1-R48 and the boundary word lines B1-B4 is only an example. The present invention is not limited thereto. In other embodiments, the controller 110 may refresh the redundancy word line R48 to the redundancy word line R1 in sequence or refresh the boundary word line B4 to the boundary word line B1 in sequence. The controller 110 may also refresh the boundary word lines B1-B4 and then refresh the redundancy word lines R1-R48. Alternatively, the controller 110 may also insert any of the boundary word lines B1-B4 into a refresh timing sequence of the redundancy word lines R1-R48. The present invention does not limit the refresh timing sequence.

Figure 3:
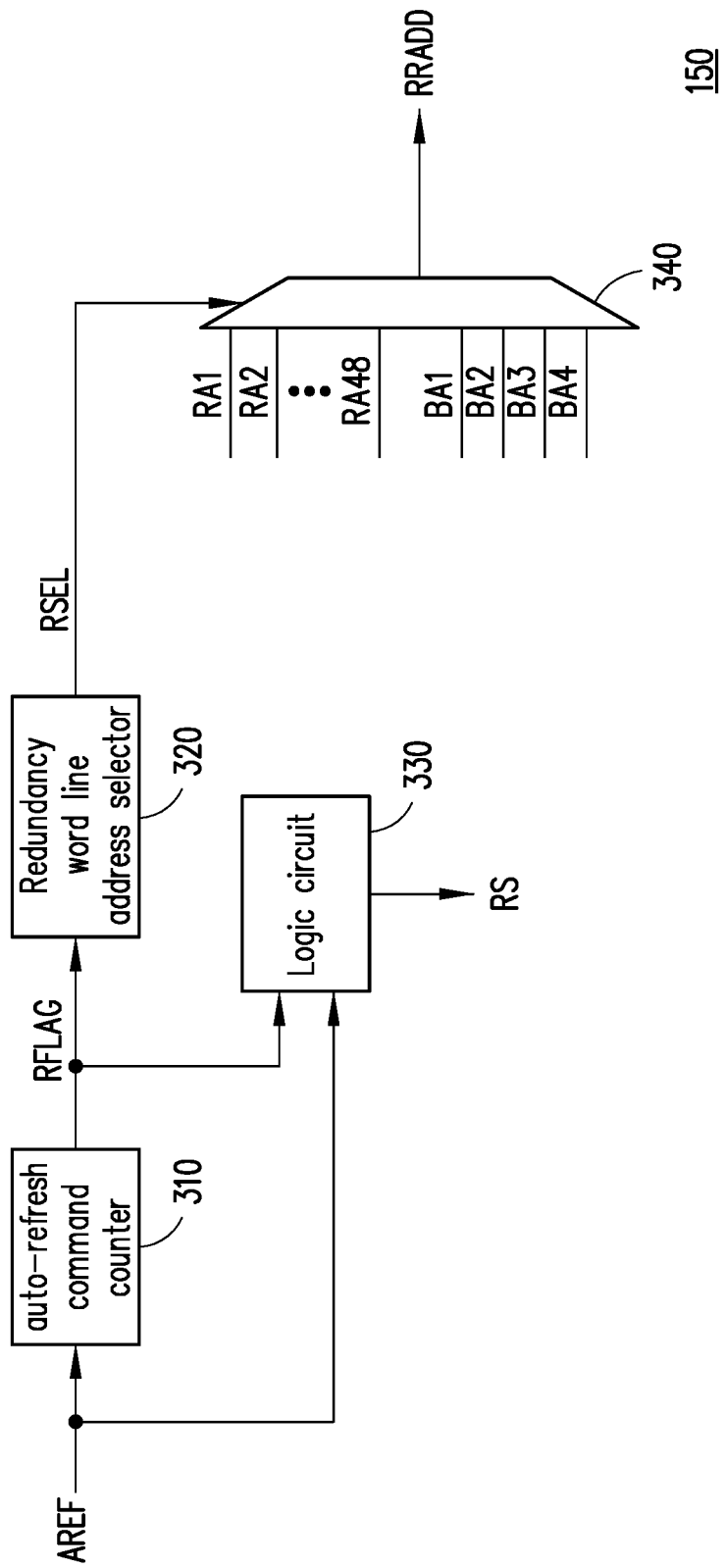
FIG. 3 is a schematic diagram of a redundancy area refresh address control circuit according to another embodiment of the present invention.
Figure 4:
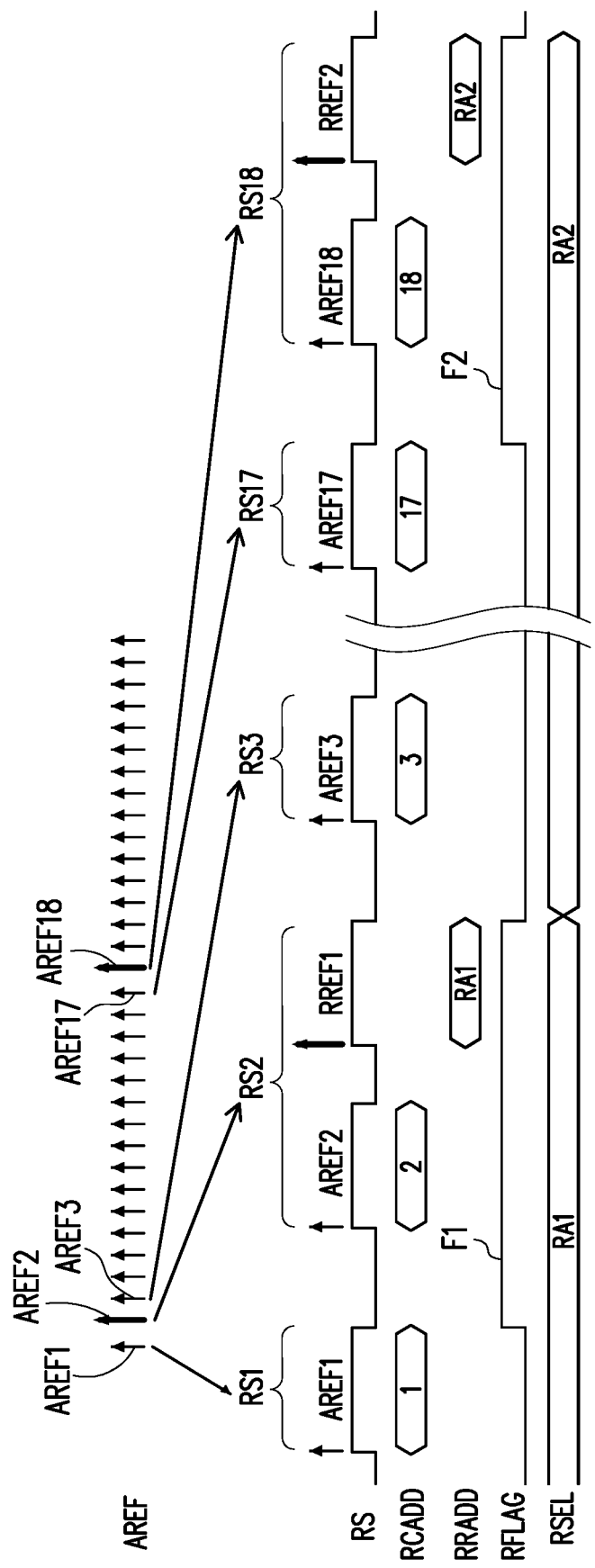
FIG. 4 is an operation timing sequence diagram of a controller according to an embodiment of the present invention.

Referring to both FIG. 3 and FIG. 4, the redundancy area refresh address control circuit 150 includes an auto-refresh command counter 310, a redundancy word line address selector 320, a logic circuit 330, and a multiplexer 340. The auto-refresh command counter 310 is configured to receive the auto-refresh command signal AREF, and generate a redundancy flag RFLAG according to the auto-refresh command signal AREF. In an embodiment, the auto-refresh command counter 310 may be a synchronous counter or an asynchronous counter, which is not limited by the present invention. The auto-refresh command counter 310 calculates the pulse ordinal number of the auto-refresh command signal AREF to generate an auto-refresh command signal pulse ordinal number. The auto-refresh command counter 310 generates pulses of the redundancy flag RFLAG every time the auto-refresh command signal pulse ordinal number is equal to a first number. In an embodiment, a refresh period of the redundancy area may be set to time after the auto-refresh command signals AREF have been issued for 16 times. For example, in a case of the auto-refresh command counter 310 receiving a pulse AREF1 representing the auto-refresh command signal AREF, in which a cumulative pulse number (i.e. the pulse ordinal number) of the auto-refresh command signal AREF has reached 16, the auto-refresh command counter 310 then generates a pulse F1 of the redundancy flag RFLAG and is reset to force the counted pulse ordinal number of the auto-refresh command signal AREF to 0. Accordingly, when the auto-refresh command counter 310 receives a pulse AREF2 representing the auto-refresh command signal AREF, the pulse ordinal number of the auto-refresh command signal AREF is 1; when the auto-refresh command counter 310 receives a pulse AREF3 representing the auto-refresh command signal AREF, the pulse ordinal number of the auto-refresh command signal AREF is 2, and so on. When the auto-refresh command counter 310 receives a pulse AREF17 representing the auto-refresh command signal AREF, the pulse ordinal number of the auto-refresh command signal AREF is 16, and then the auto-refresh command counter 310 generates a pulse F2 of the redundancy flag RFLAG and resets the counted pulse ordinal number of the auto-refresh command signal AREF to 0.

The redundancy word line address selector 320 is coupled to the auto-refresh command counter 310. The redundancy word line address selector 320 is configured to generate a redundancy word line address selection signal RSEL according to the redundancy flag RFLAG. In an embodiment, every time the auto-refresh command counter 310 generates a pulse of the redundancy flag RFLAG, the redundancy word line address selector 320 may shift a timing sequence of the redundancy word line address selection signal RSEL according to the redundancy flag RFLAG. For example, after the auto-refresh command counter 310 generates a pulse F1 of the redundancy flag, the redundancy word line address selector 320 shifts the timing sequence of the redundancy word line address selection signal RSEL at a falling edge of the pulse F1 of the redundancy flag such that the timing of the redundancy word line address selection signal RSEL is shifted into a corresponding redundancy word line address RA2 from a corresponding redundancy word line address RA1, and so on.

The multiplexer 340 is coupled to the redundancy word line address selector 320, and configured to receive the redundancy word line address selection signal RSEL, the redundancy word line addresses RA1-RA48, and the boundary word line addresses BA1-BA4, and generate a plurality of redundancy area refresh addresses RRADD in sequence based on the foregoing. For example, when the received redundancy word line address selection signal RSEL from the redundancy word line address selector 320 corresponds to the received redundancy word line address RA1, the multiplexer 340 selects the redundancy word line address RA1 and outputs it as a redundancy area refresh address RRADD. When the received redundancy word line address selection signal RSEL from the redundancy word line address selector 320 corresponds to the received redundancy word line address RA2, the multiplexer 340 selects the redundancy word line address RA2 and outputs it as a next redundancy area refresh address RRADD.

The logic circuit 330 is coupled to the auto-refresh command counter 310, and configured to receive the auto-refresh command signal AREF and the redundancy flag RFLAG, and perform logic operations according to the auto-refresh command signal AREF and the redundancy flag RFLAG to generate a refresh status signal RS. The refresh status signal RS is used for determining a timing sequence of refreshing the redundancy word lines R1-R48 and the boundary word lines B1-B4. In an embodiment, the pulse of the refresh status signal RS substantially corresponds to the pulse of the auto-refresh command signal AREF. But every time the cumulative pulse ordinal number of the auto-refresh command signal AREF is equal to 16, a next refresh status signal RS generated by the logic circuit 330 includes a pulse of the corresponding auto-refresh command signal AREF and a subsequent redundancy area refresh pulse. For example, when the auto-refresh command counter 310 receives the pulse AREF1 of the auto-refresh command signal AREF, a pulse RS1 of the refresh status signal RS corresponds to the pulse AREF1 of the auto-refresh command signal AREF. Then, since the counted pulse ordinal number of the auto-refresh command signal AREF has reached 16, the auto-refresh command counter 310 generates the pulse F1 of the redundancy flag RFLAG. Accordingly, the logic circuit 330 generates a redundancy area refresh pulse RREF1 after the pulse AREF2 according to the pulse AREF1 and the pulse F1. The redundancy area refresh pulse RREF1 corresponds to the redundancy word line address RA1, so that the pulse RS2 of the refresh status signal RS corresponds to the pulse AREF2 of the auto-refresh command signal AREF and the redundancy area refresh pulse RREF1. Then, when the auto-refresh command counter 310 receives the pulse AREF3 of the auto-refresh command signal AREF, a pulse RS3 of the refresh status signal RS corresponds to the pulse AREF3, and so on. When the auto-refresh command counter 310 receives a pulse AREF17 of the auto-refresh command signal AREF, a pulse RS17 of the refresh status signal RS corresponds to the pulse AREF17. Since the counted pulse ordinal number of the auto-refresh command signal AREF has reached 16 at this time, the auto-refresh command counter 310 then generates a pulse F2 of the redundancy flag RFLAG. The logic circuit 330 generates a redundancy area refresh pulse RREF2 after a pulse AREF18 of a next auto-refresh command signal AREF according to the pulse AREF17 and the pulse F2. The redundancy area refresh pulse RREF2 corresponds to the redundancy word line address RA2, and the pulse RS18 of the refresh status signal RS corresponds to the pulse AREF18 and the redundancy area refresh pulse RREF2.

On the other hand, the refresh address calculator 130 calculates a refresh count of the normal area to provide a refresh counting address RCADD to the refresh address multiplexer 170 such that the refresh address multiplexer 170 may know a current refresh count according to the refresh counting address RCADD. For example, when the refresh address calculator 130 receives the pulse AREF1 of the auto-refresh command signal, the refresh counting address RCADD is 1. When the refresh address calculator 130 receives the pulse AREF2 of the auto-refresh command signal, the refresh counting address RCADD is 2. When the refresh address calculator 130 receives the pulse AREF3 of the auto-refresh command signal, the refresh counting address RCADD is 3, and so on. When the refresh address calculator 130 receives the pulse AREF18 of the auto-refresh command signal, the refresh counting address RCADD is 18.

Figure 5:
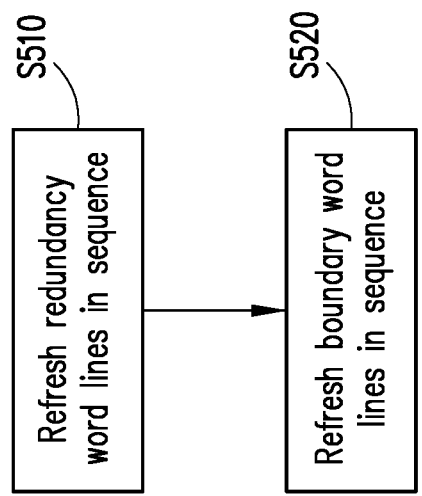
FIG. 5 is a flowchart of a refresh method according to an embodiment of the present invention.

FIG. 5 is a flowchart of a refresh method according to an embodiment of the present invention. In step S510, the controller 110 refreshes redundancy word lines R1-R48 in sequence. Then, in step S520, the controller refreshes boundary word lines B1-B4 in sequence after refreshing the redundancy word lines R1-R48 in sequence, in the present embodiment, part of normal word lines and part of redundancy word lines near boundaries between the normal areas and the redundancy area are defined as the boundary word lines. For details of steps S510 and S520, reference may be made to the embodiments of FIG. 1 to FIG. 4, and the descriptions are omitted herein.

Based on the above, in some embodiments of the present invention, the memory device and the refresh method thereof can reduce the area of a refresh address calculator. A controller refreshes redundancy word lines and boundary word lines in a memory array in sequence. Since it is unnecessary to calculate a word line address that needs to be refreshed due to a row hammer in a redundancy area, the area of a refresh address calculator can be reduced.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A memory device, comprising:
a memory array, comprising a plurality of normal areas and a redundancy area near the normal areas, each of the normal areas comprises a boundary normal word line adjacent to the redundancy area, the redundancy area comprising a plurality of middle redundancy word lines and a plurality of boundary redundancy word lines adjacent to the normal areas; and
a controller, coupled to the memory array, and configured to refresh all of the middle redundancy word lines in the redundancy area, the boundary normal word lines adjacent to the redundancy area and all of the boundary redundancy word lines in the redundancy area according to a refresh timing sequence determined by a refresh status signal,
wherein the controller comprises:
a redundancy area refresh address control circuit, configured to receive an auto-refresh command signal, and generate a plurality of redundancy area refresh addresses in sequence according to a redundancy flag, the refresh status signal, a plurality of middle redundancy word line addresses, a plurality of boundary redundancy word line addresses, and a plurality of boundary normal word line addresses,
wherein the redundancy area refresh addresses are configured to indicate all of the middle redundancy word lines in the redundancy area, the boundary normal word lines adjacent to the redundancy area and all of the boundary redundancy word lines in the redundancy area,
wherein the redundancy area refresh address control circuit comprises:
an auto-refresh command counter, configured to receive the auto-refresh command signal, and counts a pulse ordinal number of the auto-refresh command signal to generate a cumulative pulse number of the auto-refresh command signal, and generate pulses of the redundancy flag whenever the cumulative pulse number of the auto-refresh command signal is equal to a first number.

2. The memory device according to claim 1, wherein the controller refreshes the middle redundancy word lines in sequence according to the redundancy area refresh addresses, and refreshes the boundary normal word lines and the boundary redundancy word lines in sequence after refreshing the middle redundancy word lines in sequence.

3. The memory device according to claim 1, wherein the redundancy area refresh address control circuit further comprises:
a redundancy word line address selector, coupled to the auto-refresh command counter, and configured to generate a redundancy word line address selection signal according to the redundancy flag;
a multiplexer, coupled to the redundancy word line address selector, and configured to receive the redundancy word line address selection signal, the middle redundancy word line addresses, the boundary redundancy word line addresses, and the boundary normal word line addresses, and generate the redundancy area refresh addresses in sequence according to the redundancy word line address selection signal, the middle redundancy word line addresses, the boundary redundancy word line addresses, and the boundary normal word line addresses; and
a logic circuit, coupled to the auto-refresh command counter, and configured to receive the auto-refresh command signal and the redundancy flag, and generate the refresh status signal according to the auto-refresh command signal and the redundancy flag.

4. The memory device according to claim 3, wherein the redundancy word line address selector shifts a timing sequence of the redundancy word line address selection signal according to the redundancy flag whenever the auto-refresh command counter generates the pulses of the redundancy flag.

5. The memory device according to claim 3, wherein the multiplexer selects the middle redundancy word line addresses, the boundary redundancy word line addresses, and the boundary normal word line addresses in sequence according to the redundancy word line address selection signal to generate the redundancy area refresh addresses in sequence.

6. The memory device according to claim 3, wherein the refresh timing sequence determined by the refresh status signal is configured to be one of:
refreshing all of the middle redundancy word lines in the redundancy area in sequence, then refreshing one of the boundary normal word lines, then refreshing all of the boundary redundancy word lines in the redundancy area, and then refreshing the other one of the boundary normal word lines; or
refreshing all of the middle redundancy word lines in the redundancy area in sequence, and inserting the refresh timing sequence of the boundary redundancy word lines and the boundary normal word lines into the refresh timing sequence of the middle redundancy word lines.

7. A refresh method of a memory device, the memory device comprising a memory array and a controller, the memory array comprising a plurality of normal areas and a redundancy area near the normal areas, each of the normal areas comprises a boundary normal word line adjacent to the redundancy area, the redundancy area comprises a plurality of middle redundancy word lines and a plurality of boundary redundancy word lines adjacent to the normal areas, and, the refresh method comprising:
refreshing all of the middle redundancy word lines in the redundancy area, the boundary normal word lines adjacent to the redundancy area and all of the boundary redundancy word lines in the redundancy area according to a refresh timing sequence determined by a refresh status signal,
the refresh method further comprises:
receiving an auto-refresh command signal, and counting a pulse ordinal number of the auto-refresh command signal to generate a cumulative pulse number of the auto-refresh command signal, and generating pulses of a redundancy flag whenever the cumulative pulse number of the auto-refresh command signal is equal to a first number; and
generating a plurality of redundancy area refresh addresses in sequence according to the redundancy flag, the refresh status signal, a plurality of middle redundancy word line addresses, a plurality of boundary redundancy word line addresses, and a plurality of boundary normal word line addresses,
wherein the redundancy area refresh addresses are configured to indicate all of the middle redundancy word lines in the redundancy area, the boundary normal word lines adjacent to the redundancy area and all of the boundary redundancy word lines in the redundancy area.

8. The refresh method according to claim 7, further comprising:
    refreshing the middle redundancy word lines in sequence according to the redundancy area refresh addresses, and refreshing the boundary normal word lines and the boundary redundancy word lines in sequence after refreshing the middle redundancy word lines in sequence.

9. The refresh method according to claim 8, wherein the step of refreshing the middle redundancy word lines in sequence according to the redundancy area refresh addresses and refreshing the boundary normal word lines and the boundary redundancy word lines in sequence after refreshing the middle redundancy word lines in sequence comprises:
    receiving the auto-refresh command signal and the redundancy flag, and generating the refresh status signal according to the auto-refresh command signal and the redundancy flag.

10. The refresh method according to claim 9, wherein the refresh timing sequence determined by the refresh status signal is configured to be one of:
    refreshing all of the middle redundancy word lines in the redundancy area in sequence, then refreshing one of the boundary normal word lines, then refreshing all of the boundary redundancy word lines in the redundancy area, and then refreshing the other one of the boundary normal word lines; or
    refreshing all of the middle redundancy word lines in the redundancy area in sequence, and inserting the refresh timing sequence of the boundary redundancy word lines and the boundary normal word lines into the refresh timing sequence of the middle redundancy word lines.

11. The refresh method according to claim 7, wherein the step of generating the plurality of redundancy area refresh addresses in sequence comprises:
    generating a redundancy word line address selection signal according to the redundancy flag; and
    receiving the redundancy word line address selection signal, the middle redundancy word line addresses, the boundary redundancy word line addresses, and the boundary normal word line addresses, and generating the redundancy area refresh addresses in sequence according to the redundancy word line address selection signal, the middle redundancy word line addresses, the boundary redundancy word line addresses, and the boundary normal word line addresses.

12. The refresh method according to claim 11, wherein the step of generating the redundancy word line address selection signal according to the redundancy flag comprises:
    shifting a timing sequence of the redundancy word line address selection signal according to the redundancy flag whenever the pulses of the redundancy flag is generated.

13. The refresh method according to claim 11, wherein the step of receiving the redundancy word line address selection signal, the middle redundancy word line addresses, the boundary redundancy word line addresses, and the boundary normal word line addresses and generating the redundancy area refresh addresses in sequence according to the redundancy word line address selection signal, the middle redundancy word line addresses, the boundary redundancy word line addresses, and the boundary normal word line addresses comprises:
    selecting the middle redundancy word line addresses, the boundary redundancy word line addresses, and the boundary normal word line addresses in sequence according to the redundancy word line address selection signal to generate the redundancy area refresh addresses in sequence.

\* \* \* \* \*